(12) United States Patent
Gong et al.

(10) Patent No.: US 10,038,156 B2
(45) Date of Patent: Jul. 31, 2018

(54) PHOTODETECTOR UTILIZING QUANTUM DOTS AND PEROVSKITE HYBRIDS AS LIGHT HARVESTERS

(71) Applicants: Xiong Gong, Hudson, OH (US); Chang Liu, Akron, OH (US)

(72) Inventors: Xiong Gong, Hudson, OH (US); Chang Liu, Akron, OH (US)

(73) Assignee: The University of Akron, Akron, OH (US)

( * ) Notice: Subject to any disclaimer, the term of this patent is extended or adjusted under 35 U.S.C. 154(b) by 0 days.

(21) Appl. No.: 15/251,123

(22) Filed: Aug. 30, 2016

(65) Prior Publication Data

US 2017/0062139 A1    Mar. 2, 2017

Related U.S. Application Data

(60) Provisional application No. 62/212,002, filed on Aug. 31, 2015.

(51) Int. Cl.
| | |
|---|---|
| *H01L 51/42* | (2006.01) |
| *H01L 51/44* | (2006.01) |
| *B82Y 20/00* | (2011.01) |
| *B82Y 40/00* | (2011.01) |
| *H01L 51/00* | (2006.01) |

(52) U.S. Cl.
CPC .......... *H01L 51/4246* (2013.01); *H01L 51/42* (2013.01); *H01L 51/4213* (2013.01); *B82Y 20/00* (2013.01); *B82Y 40/00* (2013.01); *H01L 51/0037* (2013.01); *H01L 51/442* (2013.01); *H01L 51/447* (2013.01); *H01L 2251/308* (2013.01); *Y02E 10/549* (2013.01); *Y10S 977/774* (2013.01); *Y10S 977/813* (2013.01); *Y10S 977/892* (2013.01); *Y10S 977/954* (2013.01)

(58) Field of Classification Search
CPC .. H01L 51/42; H01L 51/4246; H01L 51/4213
See application file for complete search history.

(56) References Cited

U.S. PATENT DOCUMENTS

2017/0301479 A1* 10/2017 Moehl ................... H01G 9/209

* cited by examiner

*Primary Examiner* — Douglas Menz
(74) *Attorney, Agent, or Firm* — Renner Kenner Greive Bobak Taylor and Weber; Ray L. Weber; Timothy A. Hodgkiss

(57) ABSTRACT

A broad-band photodetector utilizes perovskite hybrid material and quantum dots as light harvesters. In particular, the photodetector is configured so that the structural defects on the surface of a quantum dot layer are passivated with perovskite hybrid material. As a result, the trap states on the surface of the quantum dot material is reduced, allowing leakage currents in the quantum dot material to be significantly reduced. As such, the photodetector is able to achieve broad-band operation, with enhanced photoresponsivity and detectivity.

15 Claims, 15 Drawing Sheets

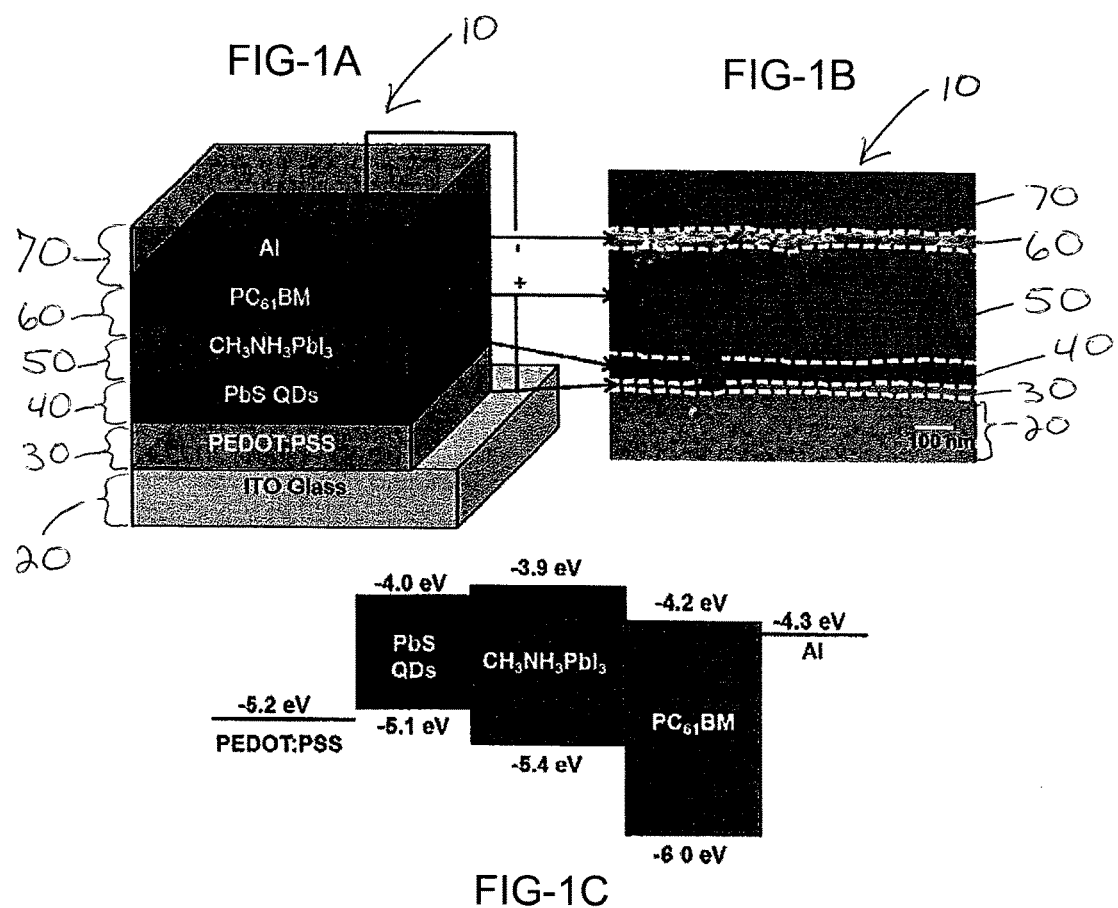

Table 1 Performance of PbS QDs/CH$_3$NH$_3$PbI$_3$ based PDs and PbS QDs/PC$_{61}$BM based PDs

| PDs | Wavelength (nm) | J$_{ph}$ (A/cm$^2$) | J$_d$ (A/cm$^2$) | EQE (%) | R (mA/W) | D$^*$ (Jones) |
|---|---|---|---|---|---|---|
| PbS QDs/CH$_3$NH$_3$PbI$_3$ | 500 | 2.4×10$^{-4}$ | 2.1×10$^{-9}$ | 75.0 | 302 | 1.2×10$^{13}$ |
| | 900 | 9.3×10$^{-5}$ | | 18.2 | 132 | 5.1×10$^{12}$ |
| PbS QDs | 500 | 9.0×10$^{-5}$ | 9.4×10$^{-8}$ | 27.2 | 110 | 6.9×10$^{11}$ |
| | 900 | 6.7×10$^{-5}$ | | 13.5 | 98 | 4.8×10$^{11}$ |

Photocurrents J$_{ph}$ are measured at λ=500 nm with the light intensity of 0.80 mW/cm$^2$ and λ=900 nm with the light intensity of 0.70 mW/cm$^2$, respectively

FIG-7

PHOTODETECTOR UTILIZING QUANTUM DOTS AND PEROVSKITE HYBRIDS AS LIGHT HARVESTERS

CROSS-REFERENCE TO RELATED APPLICATION

This application claims the benefit of U.S. Provisional Application No. 62/212,002 filed on Aug. 31, 2015, the contents of which are incorporated herein by reference.

STATEMENT REGARDING FEDERALLY SPONSORED RESEARCH OR DEVELOPMENT

This invention was made with government support under contract no. 1351785 awarded by the National Science Foundation (NSF). The government has certain rights in the invention.

TECHNICAL FIELD

Generally, the embodiments of the present invention relate to photodetectors. In particular, the embodiments of the present invention relate to photodetectors that utilize a quantum dot light harvesting material. More particularly, the embodiments of the present invention relate to photodetectors that utilize a quantum dot light harvesting material that is passivated with a perovskite hybrid material.

BACKGROUND

Optical sensing in the ultraviolet-visible (UV-vis) to the infrared (IR) spectrum is critical to a variety of activities, including: monitoring and remote sensing, fiber-optic communication, day/night-time surveillance, and medical imaging. Currently, to accomplish such sensing, separate sensors and/or materials are required to detect different sub-bands within the UV-vis to IR wavelength spectrum or range. For example, AlGaN, Si, InGaAs and PbS based photodetectors (PD) have been used to cover spectral responses that occur for wavelengths between 250 nm to 2600 nm. However, such PDs are required to be operated at low temperatures, such as 4.2 degrees Kelvin in the case of InGaAs based photodetectors for example, in order to reach high levels of detection sensitivity.

In order to avoid such low temperature operating requirements, tremendous attention has been given to the development of lead sulfide (PbS) quantum dots (QDs) based photodetectors (PDs), hereinafter referred to as PbS QD based PDs. For example, a responsivity (R) of over $10^3$ A/W with a detectivity (D*) of approximately $10^{13}$ Jones (1 Jones=1 cm $Hz^{1/2}W^{-1}$) has been achieved from PbS QD based PDs. In addition, a responsivity (R) of approximately $10^7$ A/W was further achieved from PbS QDs based PDs that incorporated highly electrically conductive graphene as light harvesters.

However, a planar thin film transistor (TFT) device structure was utilized in both cases, which led to the need for high driving voltages and slow response times, which was the result of large lateral electrode spacing (greater than 50 um) that was required for reducing the dark currents and for maintaining high gains in the TFTs. These limitations of such PbS QDs photodetectors substantially restrict their application in day/night-time surveillance and chemical/biological sensing, where high-speed and low power (e.g. low voltage) operation are desired.

In view of these drawbacks of current PbS QDs based photodetectors, it would be desirable to develop a PbS QDs based photodetector with a vertical device structure, where low driving voltages used. Unfortunately, the development of such PbS QDs has been limited due to the poor electrical conductivity of PbS QDs, which is caused by the occurrence of a substantial amount of trap states on the surface of the PbS QDs. In order to achieve high-performance PbS QDs based photodetector operation, the trap states in such photodetectors are required to be minimized or eliminated, as the trap states provide numerous sites for charge carrier recombination with the PbS QDs, while also leading to large leakage current, which results in low detectivity.

Therefore, there is a need for a photodetector that eliminates or reduces structural defects that cause trap states in the PbS QDs, by filling up the hard-to-access sites in the bandgap of the PbS QDs. In addition, there is a need for a photodetector that operates at reduced temperatures, such as room temperature, as well as low power, for optical detection of wavelengths in the spectrum between UV-vis (ultraviolet visible) to IR (infrared). There is also a need for a photodetector that has an operating performance that is similar to that of inorganic photodetectors, but which is capable of operation at room temperature. Additionally, there is a need for a photodetector that utilizes PbS QDs, which is configured with a vertical device structure.

SUMMARY

In light of the foregoing, it is one aspect of the embodiments of the present invention to provide a photodetector comprising an at least partially light transparent first electrode; a quantum dot layer positioned adjacent to the first electrode; a perovskite hybrid layer positioned directly adjacent to the quantum dot layer; and a second electrode positioned adjacent to the perovskite hybrid layer.

It is another aspect of the embodiments of the present invention to provide a method of forming a photodetector comprising providing a first at least partially light transparent electrode; providing a quantum dot layer adjacent to the first electrode; providing a perovskite hybrid layer directly adjacent to the quantum dot layer; and providing a second electrode adjacent to said perovskite hybrid layer.

BRIEF DESCRIPTION OF THE DRAWINGS

These and other features and advantages of the present invention will become better understood with regard to the following description, appended claims, and accompanying drawings wherein:

FIG. 1A is a schematic view of a photodetector having an architecture of ITO/PEDOT:PSS/PbS QDs/$CH_3NH_3PbI_3$/$PC_{61}BM$/Al in accordance with the concepts of one or more embodiments of the present invention;

FIG. 1B is a cross-sectional scanning electron microscope (SEM) image of each layer in the photodetector of FIG. 1A in accordance with the concepts of one or more embodiments of the present invention;

FIG. 1C is a graph showing the work functions of the various structural layers of the photodetector of FIG. 1A, which include PEDOT:PSS, Al, HOMO, LUMO energy levels of PbS QDs, $CH_3NH_3PbI_3$ and $PC_{61}BM$ in accordance with the concepts of one or more embodiments of the present invention;

FIG. 7 is a table showing the performance of and a PbS QDs/$PC_{61}BM$ photodetector and a PbS QDs/$CH_3NH_3PbI_3$ photodetector in accordance with the concepts of one or more embodiments of the present invention.

DETAILED DESCRIPTION

Figure 2A:
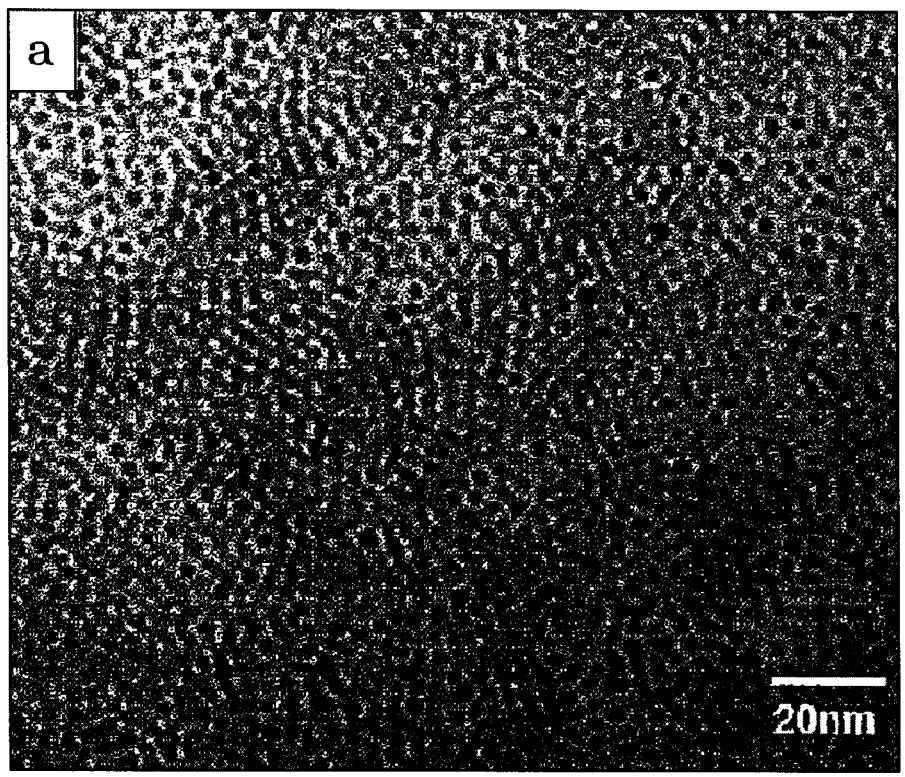
FIG. 2A is a transmission electron microscope image of PbS QDs.

A photodetector is generally referred to by numeral 10, as shown in FIGS. 1A-B of the drawings. The photodetector 10 includes a transparent conductive electrode or layer 20, which may be formed of any suitable electrically conductive material that is at least partially optically transparent, such as indium-tin-oxide (ITO). Placed adjacent to the transparent conductive layer 20, is a buffer layer 30. The buffer layer 30 may be formed of any suitable material, such as poly(3,4-ethylenedioxythiophene) polystyrene sulfonate (PEDOT:PSS) for example. Placed adjacent to the buffer layer 30 is a quantum dot layer 40. The quantum dot layer 40 may be formed of any suitable quantum dot material, such as PbS (lead sulfide) quantum dots (PbS QDs) for example. Placed directly adjacent to the quantum dot layer 40 is a perovskite hybrid layer 50, which may comprise organolead halide perovskite material, formed as $CH_3NH_3PbI_3$, as well as any other suitable hybrids of the perovskite material. Placed adjacent to the perovskite hybrid layer 50 is a buffer layer 60. The buffer layer 60 may be formed of [6,6]-phenyl-C61-butyric acid methyl ester ($PC_{61}BM$), or any other suitable material, such as n-type organic semiconductor material. Placed adjacent to the buffer layer 60 is an electrode or electrically conductive layer 70. The electrode 70 is formed of any suitable electrically conductive material, such as a low-work function metal, such as aluminum (Al) or calcium (Ca) for example. It should be appreciated that in some embodiments, one or more of the layers and electrodes 20-70 may be arranged to be directly adjacent to another layer or electrodes 20-70, such as that shown in FIG. 1A. Alternatively, in other embodiments, the layers and electrodes 20-70 may be arranged so that one or more other intervening layers or structures may be inserted at any position among or between the various layers/electrodes 20-70 of the photodetector 10, so as to be adjacent or directly adjacent to one or more of the layers and/or electrodes 20-70.

As such, perovskite hybrid material, such as organolead halide perovskite or $CH_3NH_3PbI_3$, is used to passivate the surface defects in the PbS QDs layer 40 of the photodetector 10. This is due to the fact that the perovskite hybrid material, such as $CH_3NH_3PbI_3$, has an octahedron polycrystalline structure, which is on a scale of about 1 nm, which is small enough to reach the hard-to-access surface defect sites of the PbS QDs. As a result, the trap states of the PbS QDs are minimized by filling the surface defects with the $CH_3NH_3PbI_3$ material. In addition, the $CH_3NH_3PbI_3$ itself operates as an effective light harvester, which has been progressively developed for efficient photovoltaic operation. Thus, the photodetector 10 operates as an is uncooled, ultrasensitive, and solution-processed device, while providing broad-band operation using a vertical device structure, where both the $CH_3NH_3PbI_3$ and the PbS QDs each individually act as light harvesters. Responsitivities (R) over 300 mA/W and 130 mA/W with D* exceeding $10^{13}$ Jones and $5 \times 10^{12}$ Jones have been achieved in the visible and near IR (NIR) regions, respectively using the photodetector 10. Furthermore, the photodetector 10 provides high performance, broad-band operation at room-temperatures.

Figure 2B:
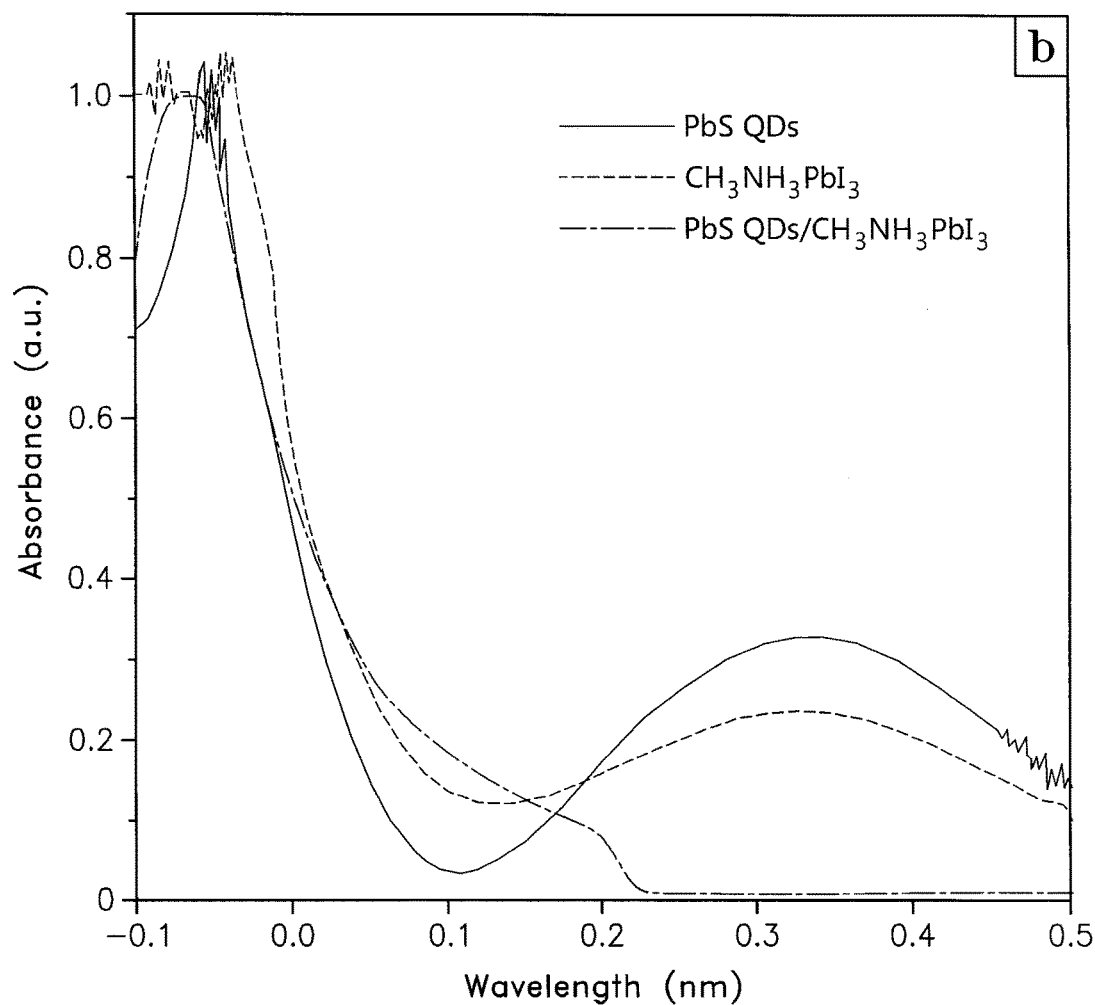
FIG. 2B is a graph showing the absorption spectra of a pristine PbS QDs thin film, a pristine $CH_3NH_3PbI_3$ thin film, and a PbS QDs/$CH_3NH_3PbI_3$ thin film in accordance with the concepts of one or more embodiments of the present invention.
Figure 2C:
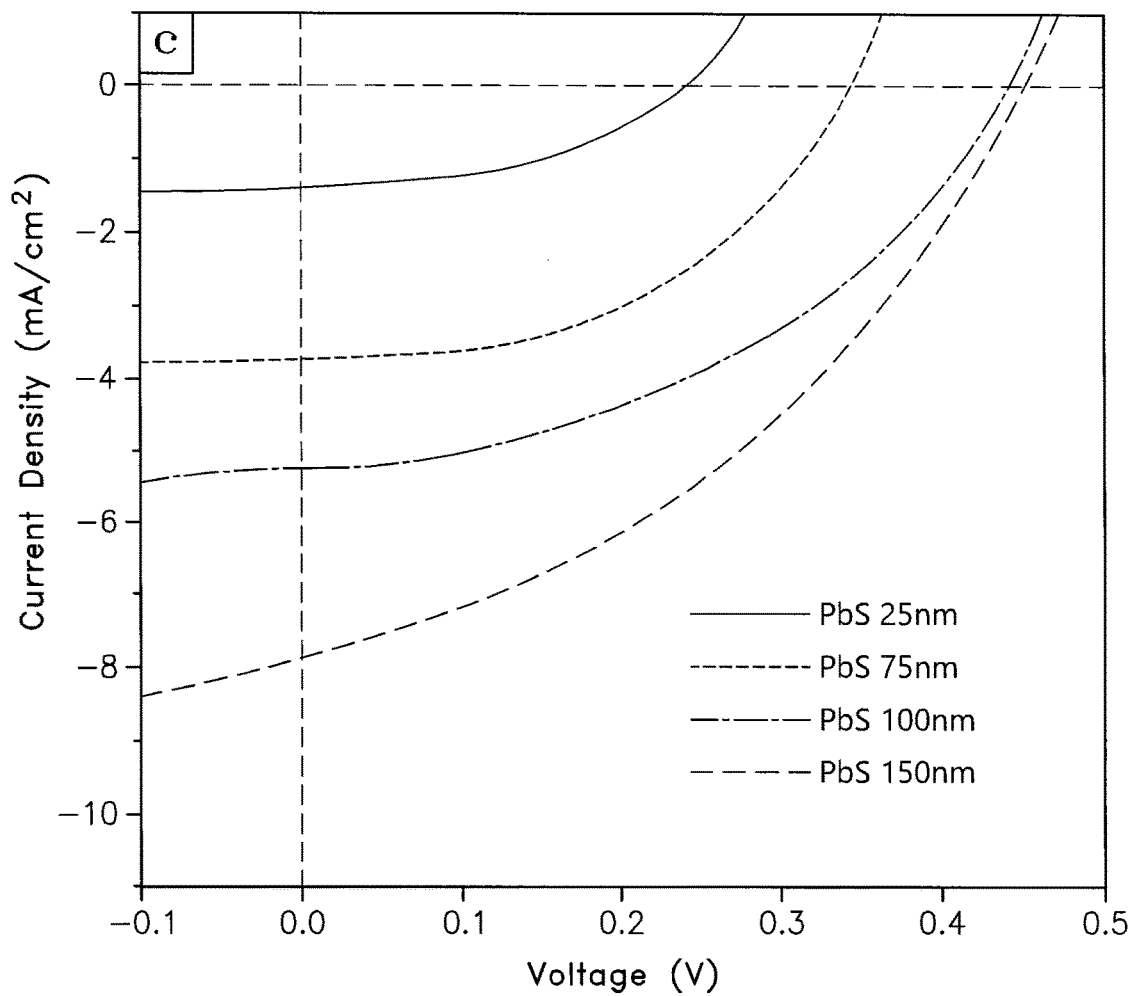
FIG. 2C is a graph showing the J-V characteristics of ITO/PEDOT:PSS/PbS QDs/$PC_{61}BM$/Al, where the PbS QDs have different thicknesses.

A TEM (transmission electron microscope) image of the PbS quantum dots of the quantum dot layer 40 used in one or more embodiments of the photodetector 10 is shown in FIG. 2A. As such, the average diameter of the PbS quantum dots used is about 5 nm, which indicates that the bandgap of the PbS QDs is about 1.1 eV. The absorption spectra of pristine PbS QDs (~100 nm), pristine $CH_3NH_3PbI_3$ (~280 nm) and PbS QDs (~100 nm)/$CH_3NH_3PbI_3$ (~280 nm) thin films is shown in FIG. 2B. The absorption spectrum of PbS QDs is from about 375 to 1100 nm. Based on the onset of the absorption spectrum, the energy bandgap of the PbS QDs is approximately 1.1 eV. The absorption spectrum of the $CH_3NH_3PbI_3$ organolead halide perovskite material is from about 375 to 800 nm. In addition, the absorption spectrum of PbS QDs/$CH_3NH_3PbI_3$ is the superposition of both the PbS QDs and the $CH_3NH_3PbI_3$ spectra, which indicates that the PbS QDs are responsible for the near infrared (NIR) absorption by the photodetector 10.

The photodetector 10 operating as a photovoltaic cell was also evaluated to assess the effect of the thin film thickness of the PbS QDs on photovoltaic performance. As such, the photodetector 10 was constructed in one embodiment to have the structure ITO/PEDOT:PS/PbS QDs/$PC_{61}BM$/Al. The current densities versus voltage (J-V) characteristics of such device is shown in FIG. 1C. As such, the photodetector 10 having a PbS QD thickness of about 100 nm possess the highest short circuit current density ($J_{SC}$) of about 8 mA/cm$^2$. Thinner films of PbS QDs result in insufficient incident light absorption. Furthermore, beacause it is easy to introduce defects in the thicker film of PbS QDs layer that is severely detrimental to $J_{SC}$, a low $J_{SC}$ is observed from the photovoltaic cells with either thinner or thicker PbS QDs. Therefore, PbS QDs with about 100 nm thickness may be used for the fabrication of the photodetector 10. However, it should be appreciated that any other thickness of the PbS QDs layer 40 may be used by the photodetector 10.

The architecture of the photodetector 10 and the cross-sectional scanning electron microscope (SEM) images of each layer in the ITO/PEDOT:PS/PbS QDs/$PC_{61}BM$/Al structure are shown in FIGS. 1A-B. The lowest unoccupied molecular orbital (LUMO) and highest occupied molecular orbital (HOMO) energy levels of $CH_3NH_3PbI_3$ and $PC_{61}BM$, conduction band (CB) and valence band (VB) of PbS QDs, and the work functions of PEDOT:PSS and Al are shown in FIG. 1C. Based on the band alignment (FIG. 1C), the photo-generated electrons and holes are created in PbS QDs thin films, followed by electrons that are transferred to the $CH_3NH_3PbI_3$ perovskite hybrid layer 50, while the holes migrate to the PEDOT:PSS/ITO electrode 20,30 due to the formation of Ohmic contact between the PbS QDs layer 40 and the PEDOT:PSS layer 30. In addition, the photo-generated electrons in the $CH_3NH_3PbI_3$ perovskite hybrid layer 50 can be transferred to the $PC_{61}BM$ electron extraction layer (EEL) 60 due to the LUMO energy offset between the $CH_3NH_3PbI_3$ perovskite hybrid layer 50 and the $PC_{61}BM$ electron extraction layer 60, while the holes are transported to the PbS QD layer 40 and further collected by the PEDOT:PSS/ITO electrode 20, 30 due to the matched HOMO energy levels of the PbS QDs and the $CH_3NH_3PbI_3$ perovskite. The synergistic actions of the above operational processes contribute to the photoresponse of the photodetector in both the visible and NIR regions.

Figure 3:
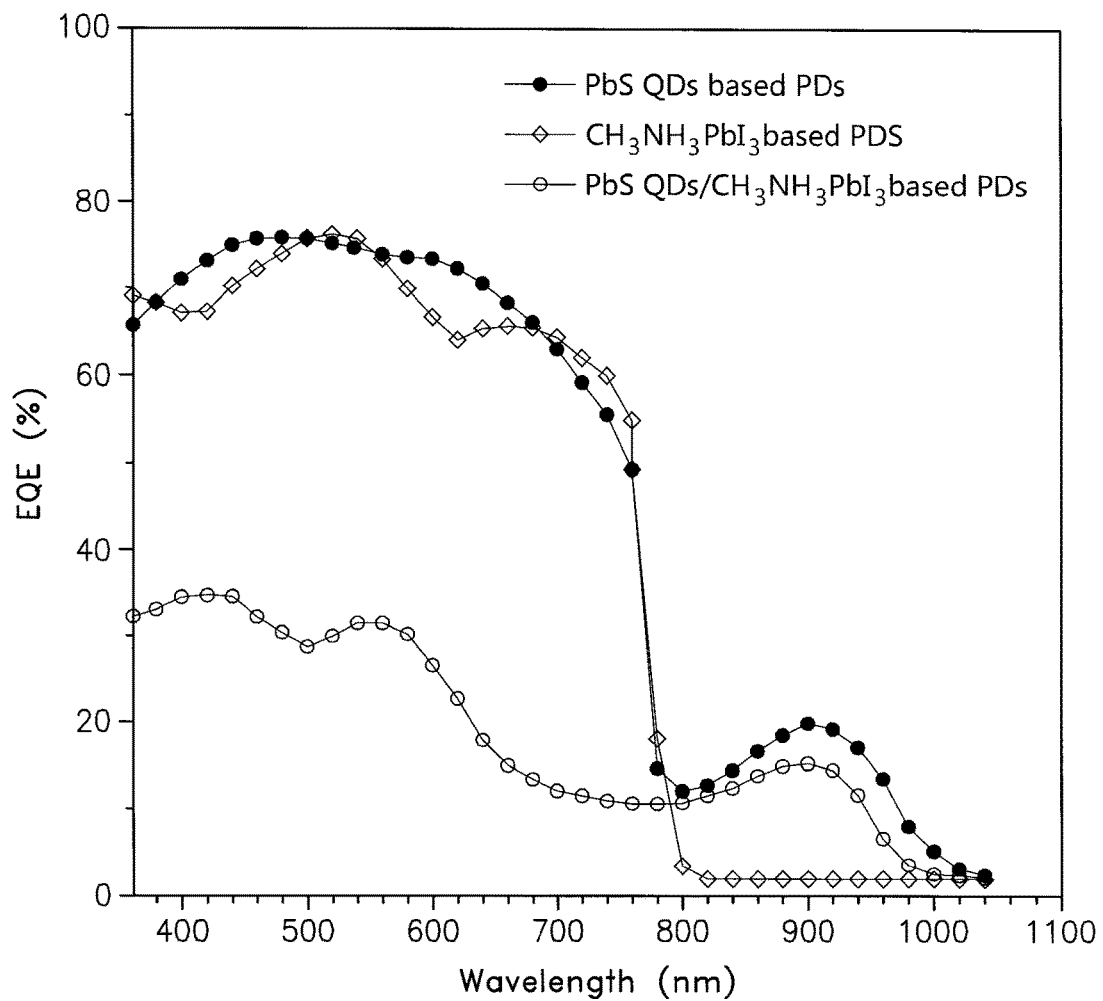
FIG. 3 is a graph showing the EQE spectra of photodetectors having an architecture of ITO/PEDOT:PSS/PbS QDs/$PC_{61}BM$/Al (Pb QDs based PDs), an architecture of ITO/PEDOT:PSS/$CH_3NH_3PbI_3$/$PC_{61}BM$/Al ($CH_3NH_3PbI_3$ based PDs), and an architecture of ITO/PEDOT:PSS/PbS QDs/$CH_3NH_3PbI_3$/$PC_{61}BM$/Al (PbS QDs/$CH_3NH_3PI_3$ based PDs) in accordance with the concepts of one or more embodiments of the present invention.

The photoresponse of the photodetector 10 with the device structure of ITO/PEDOT:PSS/PbS QDs/$CH_3NH_3PbI_3$/$PC_{61}BM$/Al (identified as PbS QDs/$CH_3NH_3PbI_3$ based PDs) was also evaluated, whereby its external quantum efficiency (EQE) spectrum (spectral response) is shown in FIG. 3. The photodetector 10 with the device structures of ITO/PEDOT:PSS/PbS QDs/$PC_{61}BM$/Al (identified as PbS QDs based PDs) and ITO/PEDOT:PSS/$CH_3NH_3PbI_3$/$PC_{61}BM$/Al (identified as $CH_3NH_3PbI_3$ based PDs) are fabricated for comparison evaluation. The EQE spectra for these structures is shown in FIG. 3. It is found that the $CH_3NH_3PbI_3$ based photodetectors exhibit no photoresponsitivity over 800 nm, which is in agreement with its absorption spectrum (FIG. 2B). The QDs/$CH_3NH_3PbI_3$ based photodetectors possess extended photoresponsitivity from visible to NIR (near infrared) regions. Moreover, by comparing the EQE spectrum of PbS QDs/$CH_3NH_3PbI_3$ based photodetectors 10 with that of PbS QDs based photodetectors in the spectral region from 375 nm to 1100 nm, the dramatically enhanced EQE values of the photodetector 10 in the visible region are attributed to the $CH_3NH_3PbI_3$ perovskite photoresponse, while the EQE enhancement in the NIR is from the PbS QDs.

Figure 4A:
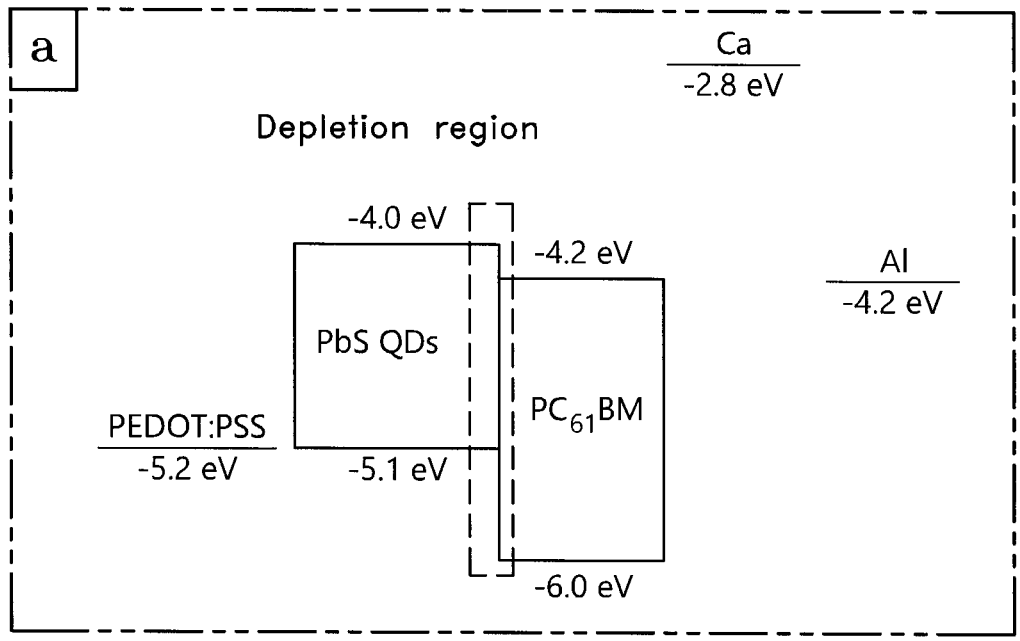
FIG. 4A is a graph showing the energy level alignments of a photodetector having an architecture of PEDOT:PSS/PbS QDs/$PC_{61}BM$/Ca/Al.
Figure 4B:
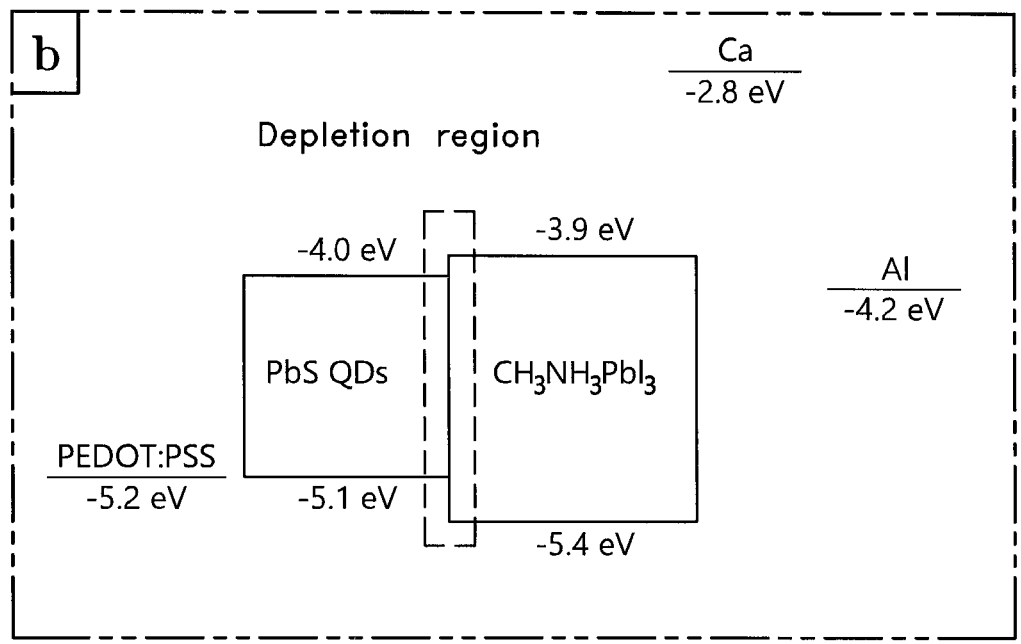
FIG. 4B is a graph showing the energy level alignments of a photodetector having an architecture of PEDOT:PSS/PbS QDs/$CH_3NH_3PbI_3$/Ca/Al in accordance with the concepts of one or more embodiments of the present invention.
Figure 4C:
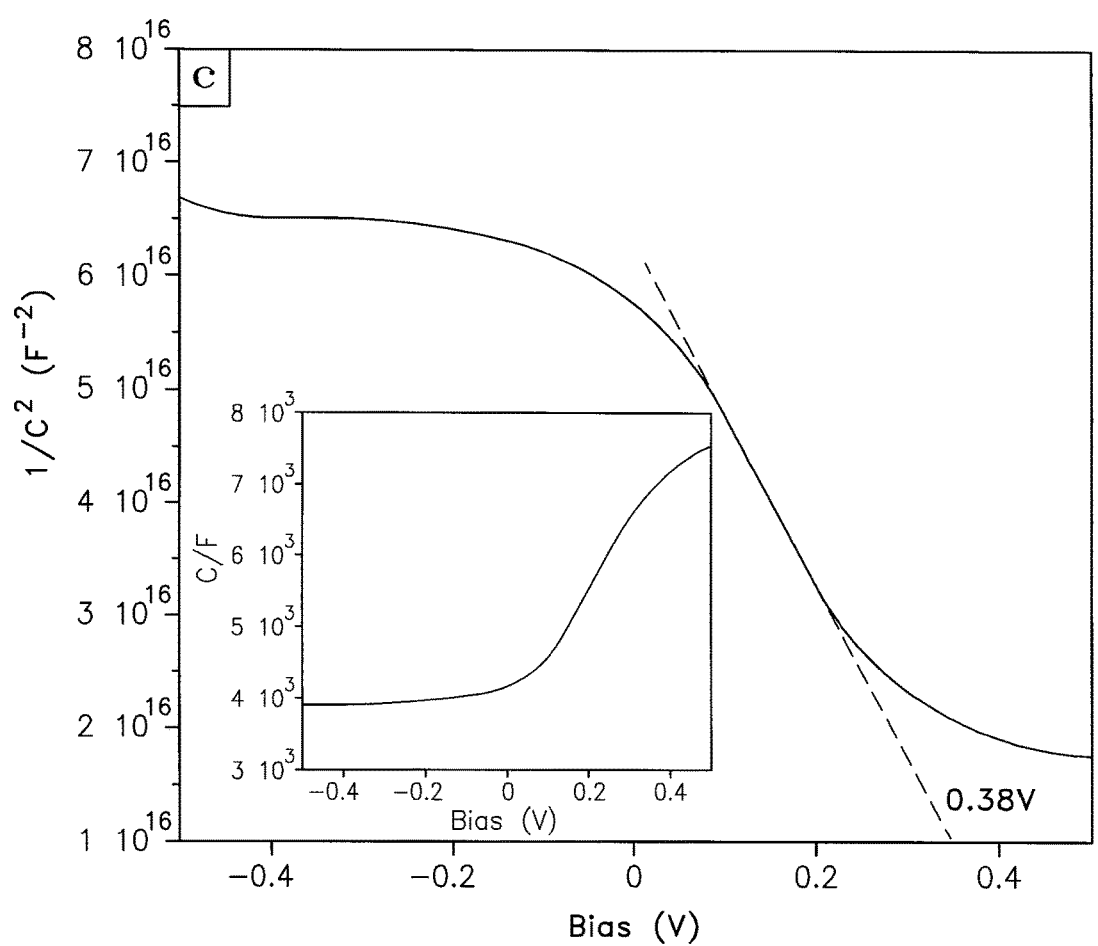
FIG. 4C is a Mott-Schottky graph of a PbS QDs/$PC_{61}BM$ two terminal photodetector.
Figure 4D:
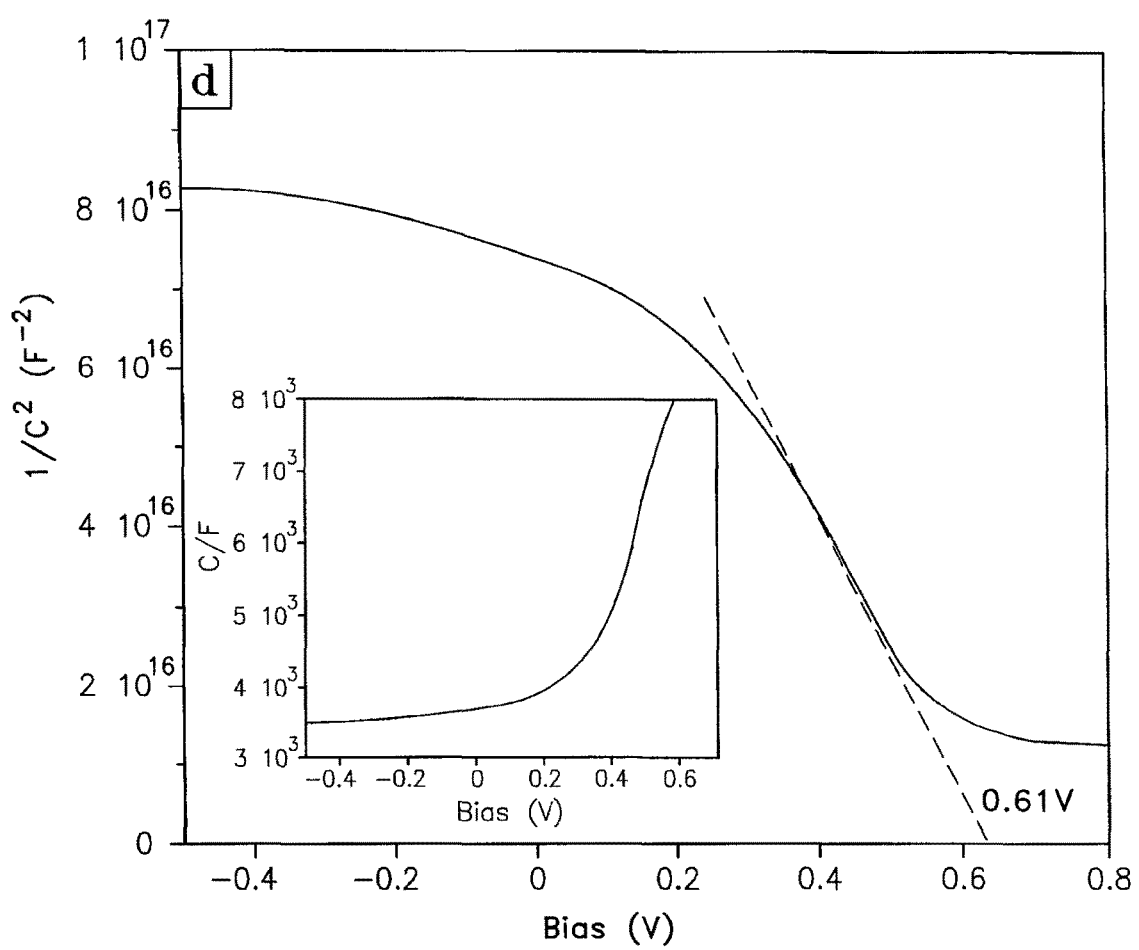
FIG. 4D is a Mott-Schottky graph of a PbS QDs/$CH_3NH_3PbI_3$ two terminal photodetector in accordance with the concepts of one or more embodiments of the present invention.

In order to understand the physical changes that occur with the enhancement of the broad-band spectral response, particularly, the NIR spectral response, from the PbS QDs/$CH_3NH_3PbI_3$ based photodetector 10, Mott-Schottky analysis was used. In particular, this analysis was first employed to evaluate how the doping density ($N_d$) and the width of the depletion region ($W_p$) in the PbS QDs changed by the incorporation of the $CH_3NH_3PbI_3$ perovskite hybrid layer 50. As such, two-terminal devices with structures of ITO/PEDOT:PSS/PbS QDs/$PC_{61}BM$/Al and ITO/PEDOT:PSS/PbS QDs/$CH_3NH_3PbI_3$/Ca/Al were fabricated and characterized to estimate $N_d$ and $W_p$ in the PbS QDs/$PC_{61}BM$ and the PbS QDs/$CH_3NH_3PbI_3$ thin films. From the band alignment shown in FIGS. 4A and 4B, the only depletion region (where the capacitance arises) in FIG. 4A is formed at the PbS QDs/$PC_{61}BM$ interface, while in FIG. 4B the depletion region is formed at the PbS QD/$CH_3NH_3PbI_3$ interface. The Mott-Schottky plots ( $$\left(\frac{1}{C^2} \text{ vs. bias voltage}\right)$$

of the PbS QDs/$PC_{61}BM$ photodetector and the PbS QDs/$CH_3NH_3PbI_3$ based photodetector 10 are shown in FIGS. 4C and 4D. The inset graphs therein show the original capacitances (C) versus voltage (C-V) characteristics of these two devices. The junction capacitances under various applied biases are then calculated from the depletion approximation. Thus, the relationship between C and $N_d$ is described by the following equation:

$$\frac{1}{C^2} = \frac{2}{\varepsilon\varepsilon_0 qAN_d}(V_{bi} - V), \qquad (1)$$

where C is the depletion region capacitance; $\varepsilon$ is the static permittivity, which is 18 for PbS QDs; $\varepsilon_0$ is the permittivity of free space; $N_d$ is the doping density of the donor; A is the active area and V is the applied voltage, respectively. The slopes of the linear regions in FIGS. 4C and 4D were calculated to be about $4.8 \times 10^{17}$ $F^{-2}V^{-1}$ and $2.5 \times 10^{17}$ $F^{-2}V^{-1}$, respectively. From these slopes, the doping densities $N_d$ in PbS QDs were estimated to be about $1.7 \times 10^{17}$ cm$^{-3}$ and $7.8 \times 10^{16}$ cm$^{-3}$ for PbS QDs/$PC_{61}BM$ and PbS QDs/$CH_3NH_3PbI_3$ thin films, respectively. In addition, the built-in potential is enhanced from 0.31 eV in a PbS QDs/$PC_{61}BM$ based photodetector to 0.61 eV in a PbS QDs/$CH_3NH_3PbI_3$ based photodetector. Such high built-in potentials are able to efficiently drive the separation of photo-generated charge carriers, resulting in high photocurrents.

The depletion width is described by the following equation as:

$$W_p = \frac{1}{N_d}\sqrt{\frac{2\varepsilon V_{bi}}{q\left(\frac{1}{N_a + N_d}\right)}}, \qquad (2)$$

where $N_a$ and $N_d$ are the doping densities of PbS QDs and $PC_{61}BM$ (or $CH_3NH_3PbI_3$), respectively. Doping densities of $PC_{61}BM$ and $CH_3NH_3PbI_3$ are about $1.0 \times 10^{16}$ cm$^{-3}$ and $2.1 \times 10^{17}$ cm$^{-3}$, respectively. According to Eq. 2, the depletion width is estimated to be about 75 nm at the PbS QDs/$PC_{61}BM$ interface, which significantly increased to about 120 nm at the PbS QDs/$CH_3NH_3PbI_3$ interface. Considering that the thickness of the PbS QDs thin film is about 100 nm, which exceeds the depletion width of the PbS QDs thin films in the PbS QDs/$PC_{61}BM$ interface, electron-hole pair recombination takes place in PbS QDs thin films for PbS QDs/$PC_{61}BM$ based photodetectors. While for PbS QDs/$CH_3NH_3PbI_3$ based photodetector 10, the whole PbS QDs thin film is depleted, and the charge carrier recombination is largely suppressed, resulting in enhanced EQE spectral response in both visible and NIR regions, as shown in FIG. 3.

Figure 4E:
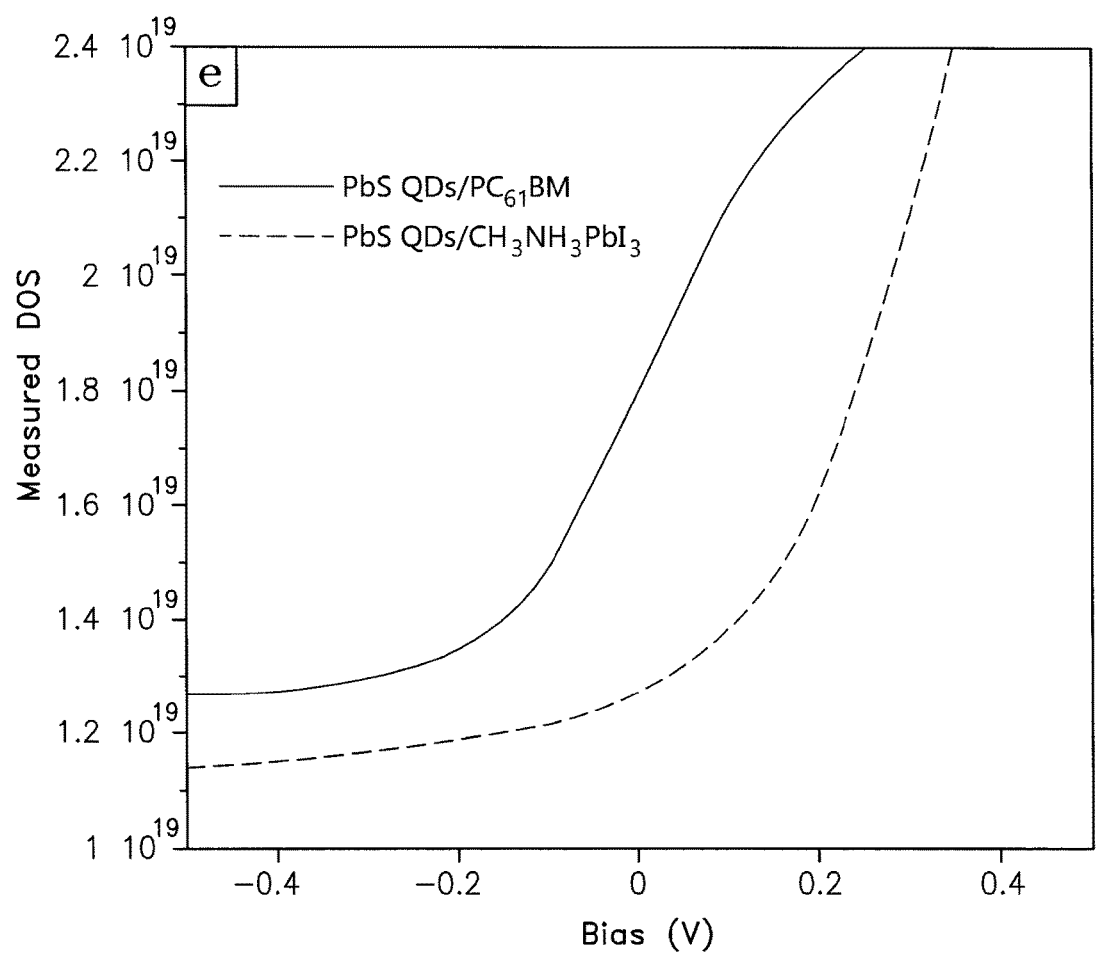
FIG. 4E is a graph showing the density of state spectra of PbS QDs/$PC_{61}BM$ and PbS/$CH_3NH_3PbI_3$ in accordance with the concepts of one or more embodiments of the present invention.

The density of states (DOS) extracted from the C-V curves was used to further investigate the trap states of the PbS QDs. The charge carrier concentrations, n, can be estimated by integrating the C-V curves over the voltages. As such, n is described as $$n = \frac{1}{Aed} \int_0^{V_{OC}} C\, dV, \quad (3)$$

where A is the device area, e is the electron charge and d is the thin film thickness. It should be noted that n is the amount of excess charge carriers that are needed to separate the quasi-Fermi levels to the corresponding voltages, or n may be the number of mid-gap states that need to be filled. Thus, the spectrum of the DOS can be obtained by differentiating the carrier density with the voltages. FIG. 4E shows the decreased trap states in the PbS QDs/$CH_3NH_3PbI_3$ thin film of the photodetector 10 as compared with that of the PbS QDs/$PC_{61}BM$ thin film. Such decreased trap states indicate that the majority of surface structural defects of PbS QDs are passivated, and the mid-gap states of the PbS QDs are subsequently removed by the $CH_3NH_3PbI_3$ perovskite hybrid material, resulting in efficient charge carrier separation and collection since the charge carrier recombination typically occurs in the mid-gap states.

Figure 5:
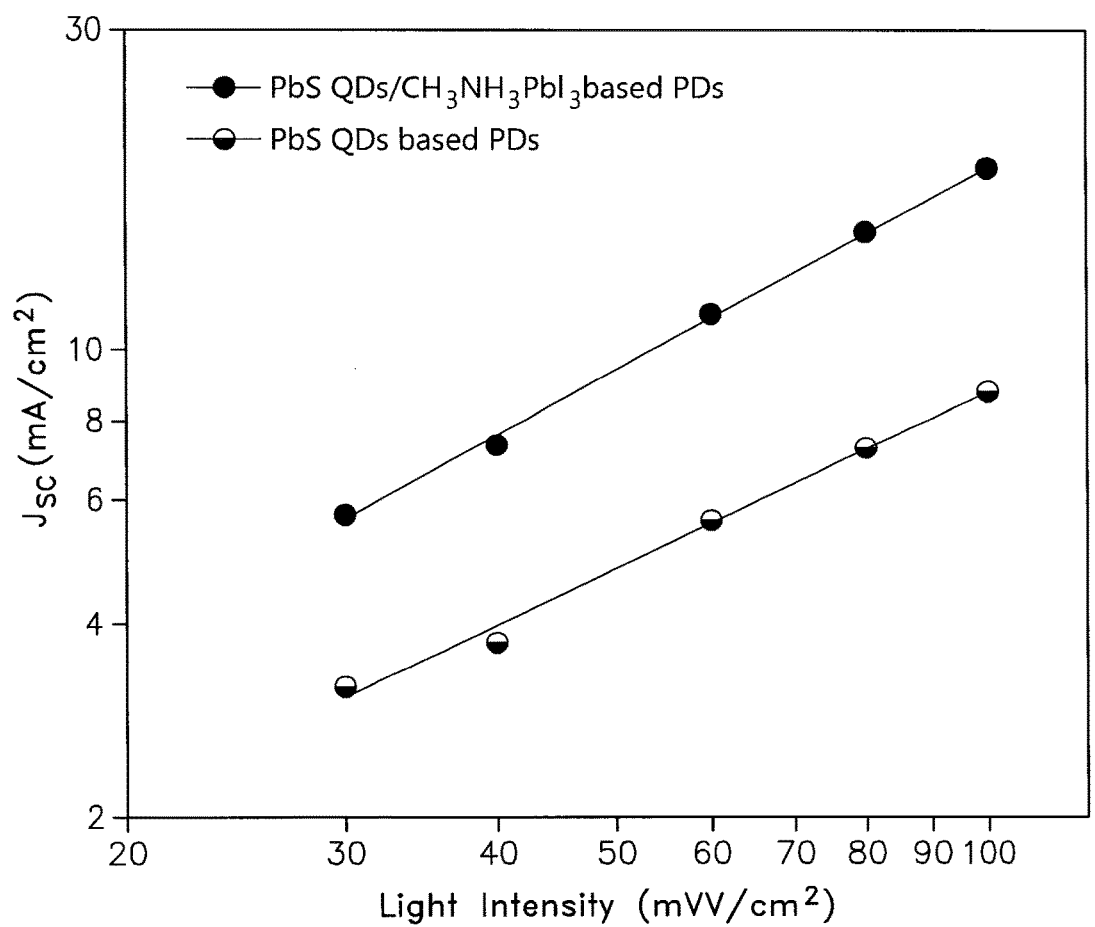
FIG. 5 is a graph showing photocurrent densities versus light intensity for a ITO/PEDOT:PSS/PbS QDs/$PC_{61}BM$/Al photodetector and a ITO/PEDOT:PSS/PbS QDs/$CH_3NH_3PbI_3$/$PC_{61}BM$/Al photodetector in accordance with the concepts of one or more embodiments of the present invention.

In order to further confirm the above conclusion, the bi-molecular recombination kinetic was investigated. The bi-molecular recombination kinetic is illustrated by the variation of $J_{SC}$ as a function of light intensities. FIG. 5 shows the steady-state light intensity dependence of $J_{SC}$ for both PbS QDs and PbS QDs/$CH_3NH_3PbI_3$ based photodetector 10. From the power-law fit, $J_{SC} \propto I^{\alpha}$, where I is the light intensity, the coefficient $\alpha$ is extracted to be 0.86 and 0.99 for the PbS QDs based photodetector and the PbS QDs/$CH_3NH_3PbI_3$ based photodetector 10, respectively. Furthermore, $\alpha=1$ indicates that all the charge carriers have been swept out prior to the recombination, while the deviation from $\alpha=1$ is attributed to the bi-molecular recombination in PbS QDs based photodetector. Consequently, it can be concluded that the bi-molecular recombination in PbS QDs is significantly suppressed upon the passivation with $CH_3NH_3PbI_3$ perovskite hybrid material, which is in agreement with the Mott-Shottkey analysis and the DOS results described above. Therefore, the enhancement of the visible and NIR spectral responses in the PbS QDs/$CH_3NH_3PbI_3$ based photodetector 10, where both PbS QDs and $CH_3NH_3PbI_3$ perovskite hybrid material layer 50 are utilized as co-light-harvesters, originates from the combined function of $CH_3NH_3PbI_3$, which simultaneously passivates the trap states on the surfaces of PbS QDs and also broadens the depletion region in the PbS QDs thin film layer 40.

Figure 6A:
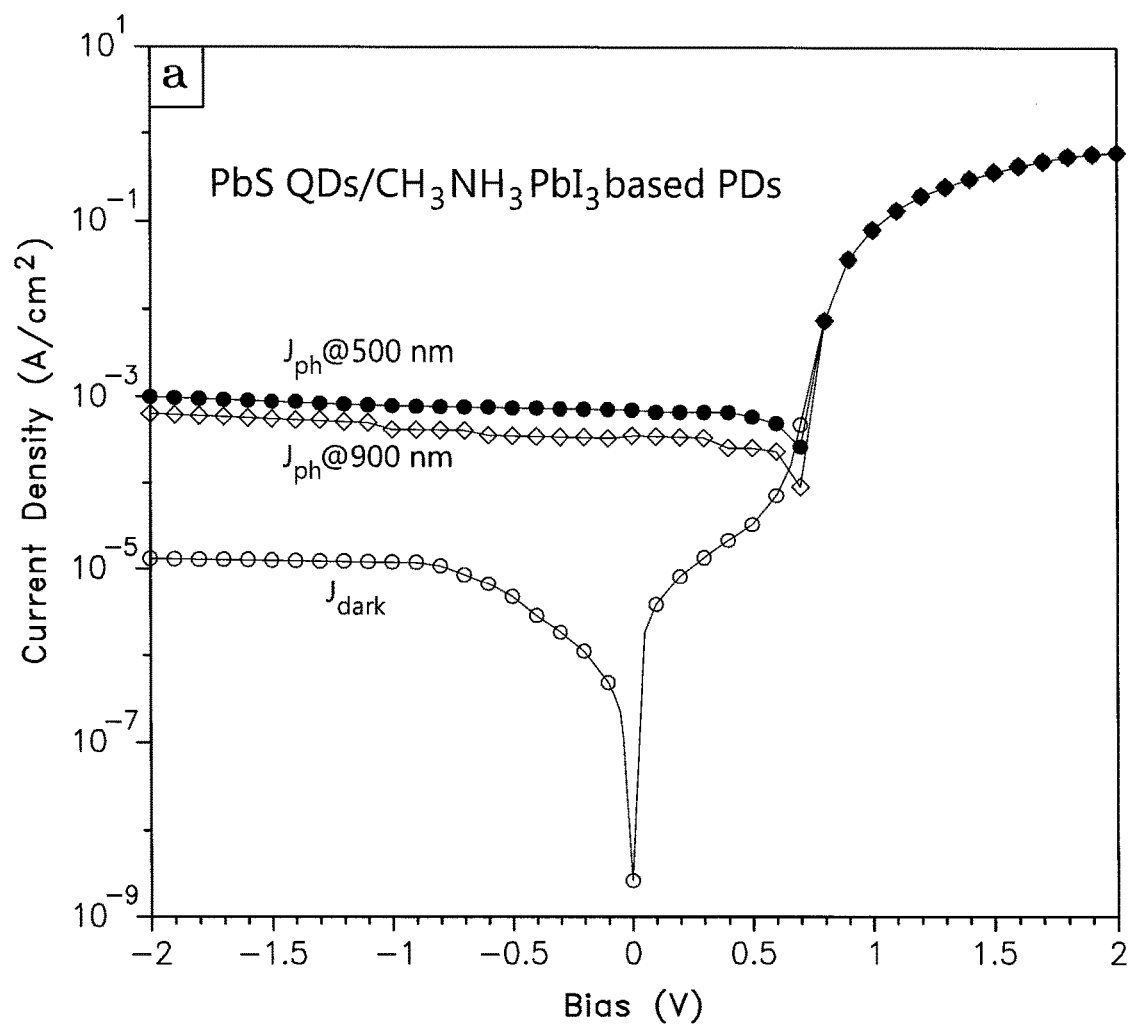
FIG. 6A is a graph showing J-V characteristics of an ITO/PEDOT:PSS/PbS QDs/$CH_3NH_3PbI_3$/$PC_{61}BM$/Al photodetector under dark and under monochromatic illumination at wavelengths of 500 nm and 900 nm with a light intensity of 0.80 mW/cm$^2$ and 0.70 mW/cm$^2$ in accordance with the concepts of one or more embodiments of the present invention.
Figure 6B:
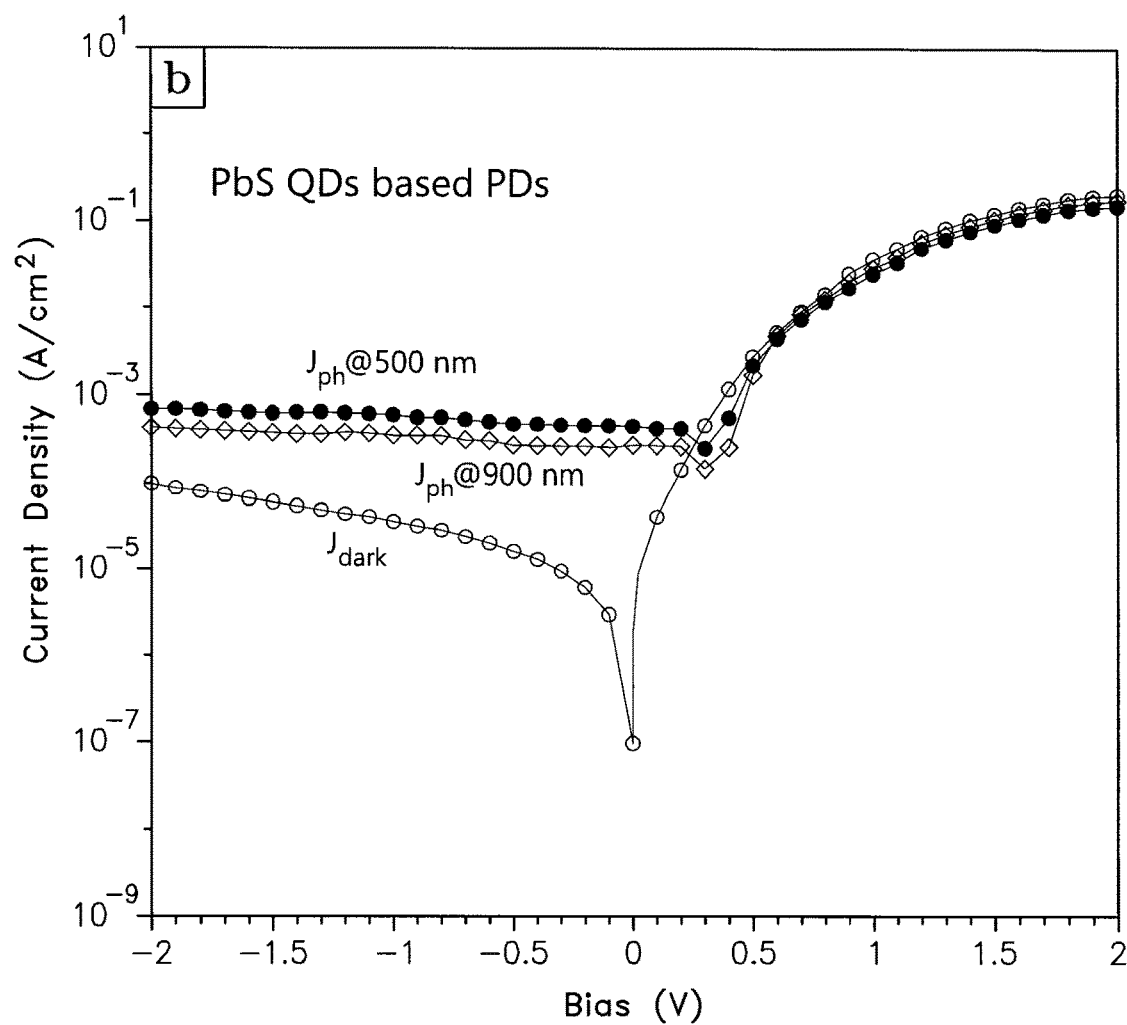
FIG. 6B is a graph showing J-V characteristics of an ITO/PEDOT:PSS/PbS QDs/$PC_{61}BM$/Al photodetector under dark and under monochromatic illumination at wavelengths of 500 nm and 900 nm with a light intensity of 0.80 mW/cm$^2$ and 0.70 mW/cm$^2$.

The PbS QDs/$CH_3NH_3PbI_3$ based photodetector 10 and PbS QDs based photodetector 10 were further analyzed by J-V characteristics in dark conditions and under illumination by monochromatic light at a wavelength ($\lambda$) of about 500 and 900 nm, measured at room temperature. The J-V characteristics of the two different photodetectors above are shown in FIGS. 5A and 5B. It is found that the dark current density ($J_d$) of $2.1 \times 10^{-9}$ A/cm$^2$ for the PbS QDs/$CH_3NH_3PbI_3$ based photodetector 10 was lowered by nearly two times, as compared to $9.4 \times 10^{-8}$ A/cm$^2$ for the PbS QDs based photodetector. These results confirm that the surface structural defects of PbS QDs are passivated by the $CH_3NH_3PbI_3$ perovskite hybrid material 50 with a diminutive molecular scale, which effectively eliminates the leakage current that occurs at the defect sites, which is highly desirable. FIGS. 6A and 6B also show that under illumination of monochromatic light, at $\lambda=900$ nm with an light intensity of 0.70 mA/cm$^2$, the $J_{ph}$ of the PbS QDs/$CH_3NH_3PbI_3$ based photodetector and the PbS QDs based photodetector 10 are about $9.3 \times 10^{-5}$ A/cm$^2$ and $6.7 \times 10^{-5}$ A/cm$^2$, respectively. The higher $J_{ph}$ from the PbS QDs/$CH_3NH_3PbI_3$ based photodetector 10 over that of the PbS QDs based photodetector, which is inconsistent with the EQE values, confirms the previous C-V and DOS measurements.

According to $$R = \frac{I_{ph}}{L_{light}},$$

where $J_{ph}$ is the photocurrent and $L_{light}$ is the incident light intensity, the responsivity (R) from two different photodetectors is calculated. The detectivities (D*) are estimated based on the equation $D^* = R/(2qJ_d)^{1/2}$, where q is the absolute value of the electron charge ($1.6 \times 10^{-19}$ Coulombs), and $J_d$ is the dark current density (A/cm$^2$). The R and D* from these two PDs are summarized in Table 1, shown in FIG. 7. The R of 110 mA/W and 98 mA/W, with D* of $6.9 \times 10^{11}$ Jones and $4.8 \times 10^{11}$ Jones are observed from PbS QDs based photodetectors at $\lambda=500$ nm and $\lambda=900$ nm, respectively. The R of 302 mA/W and 132 mA/W, with D* of $1.2 \times 10^{13}$ Jones and $5.1 \times 10^{12}$ Jones are observed from PbS QDs/$CH_3NH_3PbI_3$ based photodetectors at $\lambda=500$ nm and $\lambda=900$ nm, respectively. Moreover, the device performance parameters from PbS QDs/$CH_3NH_3PbI_3$ based photodetectors are the highest values for PbS QDs based photodetectors with a vertical device structure reported.

Figure 6C:
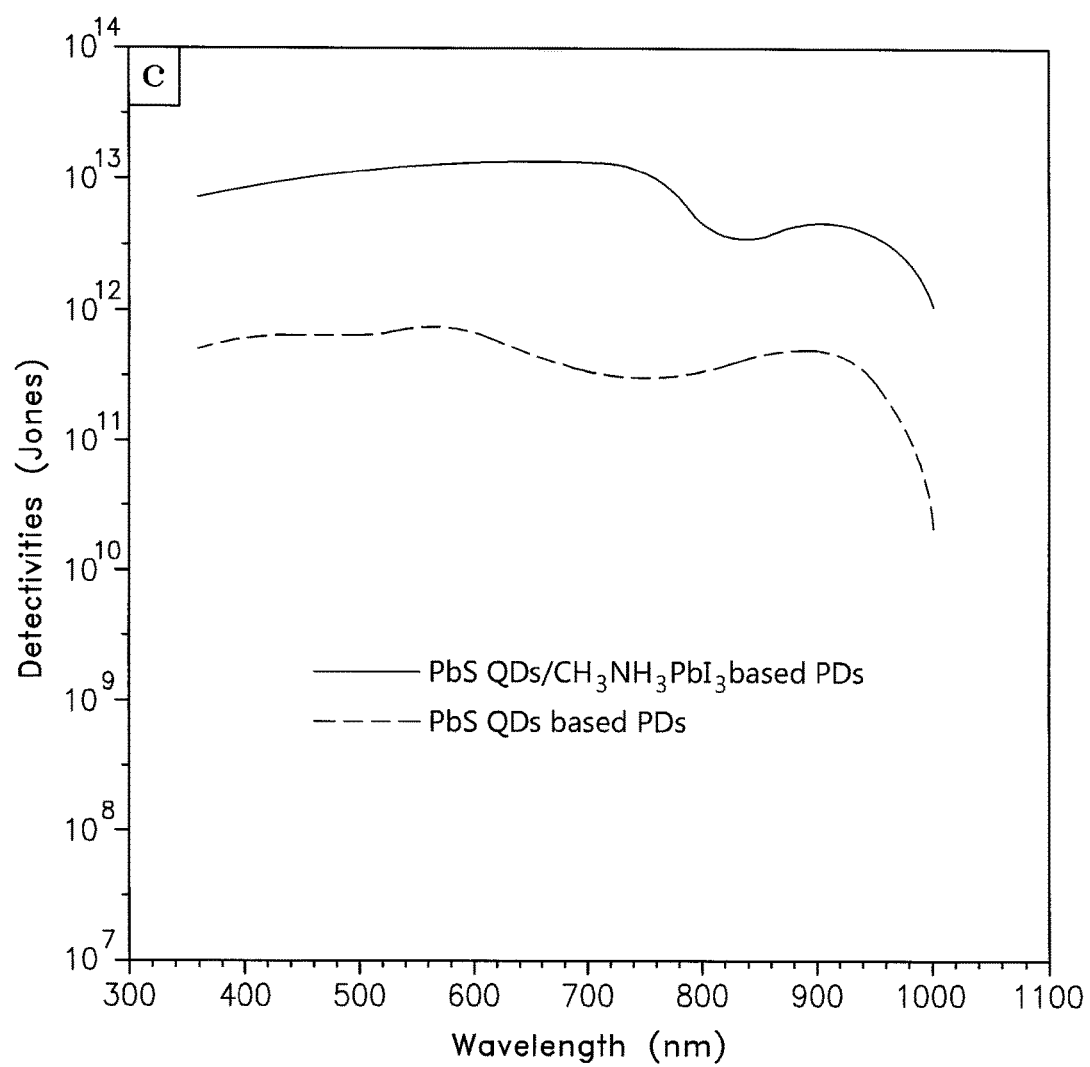
FIG. 6C is a graph showing the detectivities versus wavelength for an ITO/PEDOT:PSS/PbS QDs/$PC_{61}BM$/Al photodetector and a ITO/PEDOT:PSS/PbS QDs/$CH_3NH_3PbI_3$/$PC_{61}BM$/Al photodetector in accordance with the concepts of one or more embodiments of the present invention.

In addition, D* versus different wavelengths were estimated based on the EQE spectra of the photodetectors, the results of which are shown in FIG. 6C. Thus, the D* of PbS QDs/$CH_3NH_3PbI_3$ based photodetector 10 are over one order of magnitude higher than those of PbS QDs based photodetectors, even in the NIR region. Such a large enhancement is the consequence of the combined function of $CH_3NH_3PbI_3$ perovskite hybrid material 50 used by the photodetector 10, which simultaneously passivates the surface trap states of the PbS QDs layer 40 and broadens the depletion region in the PbS QD thin film layer 40, which contributes to the remarkably suppressed dark current and enhanced photoresponse of the photodetector 10, respectively.

Figure 6D:
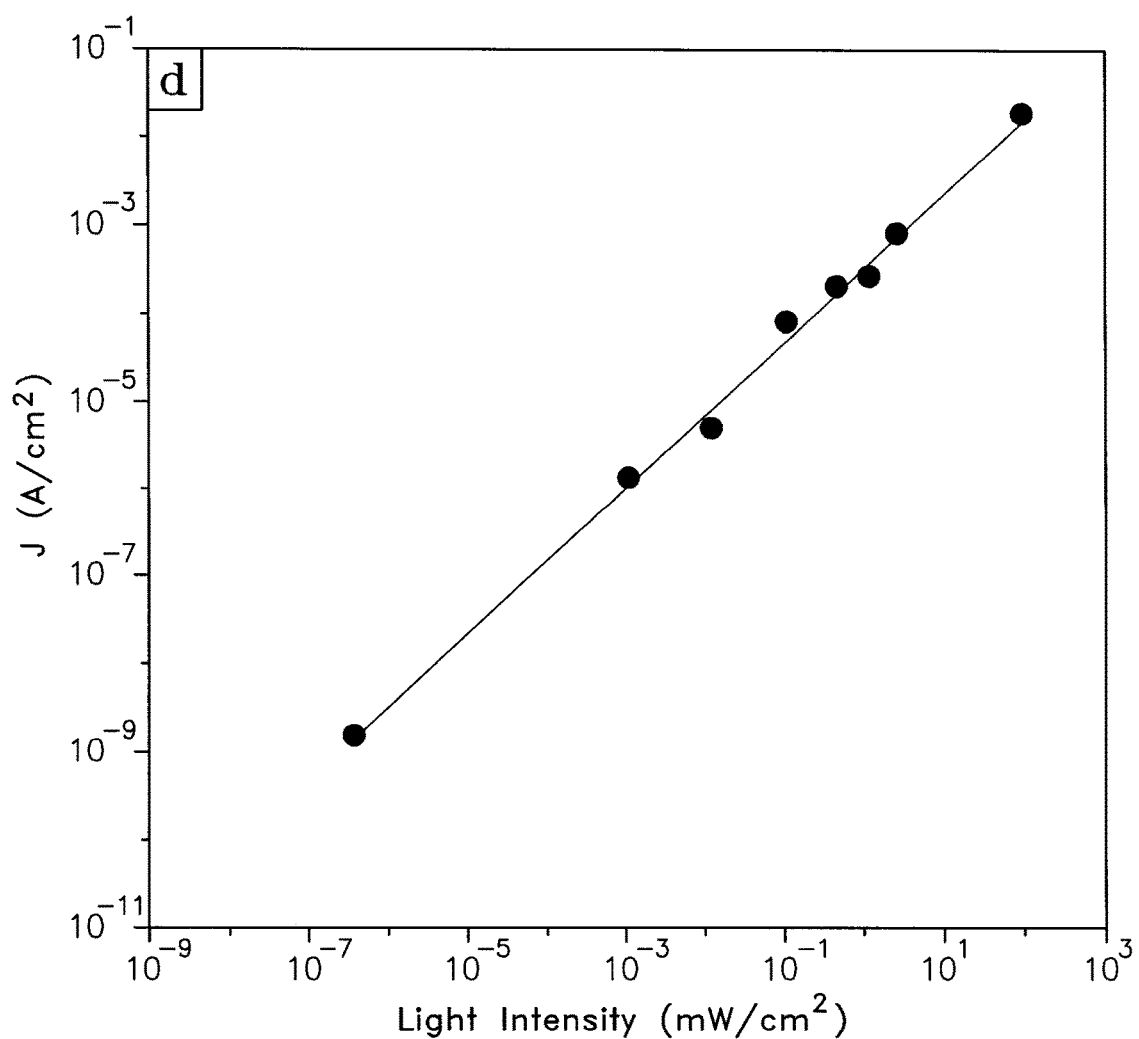
FIG. 6D is a graph showing the linear dynamic range of ITO/PEDOT:PSS/PbS QDs/$CH_3NH_3PbI_3$/$PC_{61}$ BM/Al NIR photodetector in accordance with the concepts of one or more embodiments of the present invention.

The photocurrent densities versus the incident light intensity for the photodetectors are also measured and the results are shown in FIG. 6D. The linear dynamic range (LDR) or photosensitivity linearity (typically identified in dB) is calculated according to the equation of LDR=20 log($J^*_{ph}$/$J_{dark}$), where $J^*_{ph}$ is the photocurrent measured at the light intensity of 1 mW/cm². The LDR is over 100 dB for the PbS QDs/CH$_3$NH$_3$PbI$_3$ based photodetector 10, which is comparable to that of Si photodetectors (120 dB) and is significantly higher than that of InGaAs (66 dB) photodetectors. These results all demonstrate that the PbS QDs/CH$_3$NH$_3$PBI$_3$ based broad-band photodetector 10 is capable of operational performance that is comparable to Si photodetectors and InGaAs photodetectors.

Thus, the embodiments of the photodetector 10 provide a facile approach to improving the performance of PbS QDs based broad-band photodetectors. Passivating the surface structural defects of PbS QDs with small molecular-scaled CH$_3$NH$_3$PbI$_3$ organolead halide perovskite hybrid material not only significantly removes the trap states in the bandgap of PbS QDs, but also tremendously suppresses the dark current of the PbS QDs/CH$_3$NH$_3$PbI$_3$ based photodetector 10, which effectively brings down the recombination losses and consequently raises the photoresponse of the photodetectors. In addition, CH$_3$NH$_3$PbI$_3$ perovskite hybrid material 50 itself is a light-absorber, which contributes large photocurrents in the visible region. As a result, photodetector 10 exhibits broad spectral response from 375 nm to 1100 nm, with a high responsivity over 300 mA/W and 130 mA/W, a high detectivity larger than $10^{13}$ Jones and $5 \times 10^{12}$ Jones in the visible and NIR regions. The embodiments of the photodetector 10 also possess a linear dynamic range of about 100 dB. Furthermore, the performance of the photodetector 10 is comparable to those of inorganic photodetectors and indicate that the photodetector 10 of the embodiments of the present invention provide a facile and promising route for advancing the performance of broadband photodetectors.

Experimental Results:

Materials:

P-type PbS QDs, PBI$_2$, PC$_{61}$BM were purchased from Evident Technology, Inc., Alfa Aesar and Nano C Inc., respectively, and were used as received without further purification to form the photodetector 10. Methylammonium iodide (CH$_3$NH$_3$I, MAI) was synthesized in a lab. The perovskite precursor solution was prepared, whereby PbI$_2$ and MAI were dissolved in dimethylformamide (DMF) and ethanol with the concentrations of 400 mg/mL for PbI$_2$, and 35 mg/mL for MAI, respectively. All of the solutions were heated at about 100° C. for around 10 minutes to ensure that both the MAI and PbI$_2$ were fully dissolved.

Thin Film Preparation and Characterization:

Ultra-violet visible (UV-vis) light absorption spectra of PbS QDs, CH$_3$NH$_3$PbI$_3$ and PbS QDs/CH$_3$NH$_3$PbI$_3$ thin films were measured using an HP 8453 spectrophotometer. Cross-sectional scanning electron microscope (SEM) images were measured by Model JEOL-7401 Japan electron optics laboratory (JEOL). The top-view transmission electron microscope (TEM) images were measured by Model JEOL JSM-1230. Photoluminescence (PL) spectra was obtained with a 532 nm pulsed laser as an excitation source at a frequency of about 9.743 MHz. The thickness of the PbS QDs and CH$_3$NH$_3$PbI$_3$ thin films were obtained by atomic force microscope (AFM) measurement.

Device Fabrication:

PEDOT:PSS was spin-cast onto the top of pre-cleaned ITO substrates, followed by depositing multiple layers of PbS QDs followed with ligand exchange. The fabrication procedure utilized is as follows: the first layer of PbS QDs was spin-coated on the top of the PEDOT:PSS from 10mg/mL toluene solvent at about 1000 RPM for approximately 20 seconds, followed by rinsing the thin film in 1,2-ethanedithiol (EDT)/methanol solution (10 vol %) for about 30 seconds and then spin-cast for about 10 seconds to dry the film. The film was subsequently rinsed in methanol solvent to remove the excess EDT and then spin-cast for approximately 10 seconds to dry the film. Multiple layers of PbS QDs were fabricated by repeating the above procedures to obtain the desired thickness, and then annealed in air at about 90° C. for approximately 3 hours to complete the treatment. The CH$_3$NH$_3$PbI$_3$ perovskite hybrid thin films were then processed by a 2-step fabrication method, whereby a PbI$_2$ layer was spin-coated from 400 mg/mL DMF solution at about 3000 RPM for about 35 seconds on the top of the PbS QDs layer, then the thin film was dried at about 70° C. for approximately 5 minutes. After the film was cooled to room temperature, the MAI layer was the spin-coated on the top of the PbI$_2$ layer from 35 mg/mL ethanol solution at about 3000 RPM for about 35 seconds, followed by transferring to the hot plate (100° C.) immediately. After thermal annealing at about 100° C. for approximately 2 hours, the PC$_{61}$BM layer was deposited from 20 mg/mL chlorobenzene solution at about 1000 RPM for about 55 seconds. Lastly, the pero-HSCs where finished by thermal evaporation of the aluminum (Al) (100 nm). The resulting device area was defined to be about 0.16 cm².

Device Characterization:

The electrical current densities versus the voltage (J-V) characteristics of the various photodetectors were measured using a Keithley 2400 source-power unit. The photodetectors were characterized using a solar simulator at a wavelength of about 500 nm with an irradiation intensity of about 0.80 mW/cm² and 900 nm with an irradiation intensity of about 0.70 mW/cm². The external quantum efficiency (EQE) of the photodetectors was measured with a commercial photomodulation spectroscopic setup (DSR 100UV-B) including a xenon lamp, an optical chopper, a monochromator, a lock-in amplifier operated by a PC computer, and a calibrated Si photodiode. The capacitance versus the voltage (C-V) characteristics were measured by a Keithley model 82-WIN Simultaneous CV System.

Thus, it can be seen that the objects of the embodiments of the present invention have been satisfied by the structure and its method for use presented above. While in accordance with the Patent Statutes, only the best mode and preferred embodiments have been presented and described in detail, with it being understood that the embodiments of the present invention are not limited thereto or thereby. Accordingly, for an appreciation of the true scope and breadth of the invention, reference should be made to the following claims.

What is claimed is:

1. A photodetector comprising:
    an at least partially light transparent first electrode;
    a quantum dot layer positioned adjacent to said first electrode, said quantum dot layer having at least one defect site;
    a perovskite hybrid layer positioned directly adjacent to said quantum dot layer and configured to fill said at least one defect site; and
    a second electrode positioned adjacent to said perovskite hybrid layer.

2. The photodetector of claim 1, wherein said first electrode comprises indium-tin-oxide (ITO).

3. The photodetector of claim 1, wherein said quantum dot layer comprises lead sulfide (PbS) quantum dots.

4. The photodetector of claim 1, wherein said perovskite hybrid layer comprises $CH_3NH_3PbI_3$.

5. The photodetector of claim 1, wherein said second electrode comprises a low work-function metal.

6. The photodetector of claim 5, wherein said low work-function metal is comprises Al or Ca.

7. The photodetector of claim 1, further comprising a first buffer layer positioned between said first electrode and said quantum dot layer.

8. The photodetector of claim 7, wherein said first buffer layer comprises PEDOT:PSS.

9. The photodetector of claim 1, further comprising a second buffer layer positioned between said second electrode and said perovskite layer.

10. The photodetector of claim 9, wherein said second buffer layer comprises $PC_{61}BM$.

11. The photodetector of claim 9, wherein said second buffer layer comprises n-type organic semiconductor material.

12. The photodetector of claim 1, wherein said first electrode, said quantum dot layer, said perovskite hybrid layer, and said second electrode are arranged along a vertical axis.

13. The photodetector of claim 1, wherein said perovskite hybrid layer is solution processed.

14. The photodetector of claim 1, wherein said quantum dot layer comprises a plurality of layers of quantum dots.

15. The photodetector of claim 1, wherein said quantum dot layer is annealed.

* * * * *